United States Patent
Liu

(10) Patent No.: US 6,486,535 B2
(45) Date of Patent: Nov. 26, 2002

(54) ELECTRONIC PACKAGE WITH SURFACE-MOUNTABLE DEVICE BUILT THEREIN

(75) Inventor: Sheng Tsung Liu, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 09/811,394

(22) Filed: Mar. 20, 2001

(65) Prior Publication Data

US 2002/0135049 A1 Sep. 26, 2002

(51) Int. Cl.⁷ .............................................. H01L 23/495
(52) U.S. Cl. ........................ 257/666; 257/528; 257/532; 257/786; 257/531
(58) Field of Search ................................. 257/528, 532, 257/531, 666, 786

(56) References Cited

U.S. PATENT DOCUMENTS 5,484,959 A  *  1/1996  Burns ........................ 174/524
5,530,622 A     6/1996  Takiar et al.
5,608,359 A  *  3/1997  Knecht et al. ................. 331/68
5,677,566 A  * 10/1997  King et al. .................. 257/666
6,054,764 A     4/2000  Howser et al.
6,100,112 A  *  8/2000  Amano et al. .............. 438/106
6,310,752 B1 * 10/2001  Shrier et al. ................... 361/56
6,313,520 B1 * 11/2001  Yoshida et al. ............. 257/676

* cited by examiner

Primary Examiner—Nathan J. Flynn
Assistant Examiner—Leonardo Anduja

(57) ABSTRACT

An electronic package comprises a lead frame having a die pad for supporting a semiconductor chip. The electronic package is characterized by directly mounting at least a surface-mountable device on the lead frame thereby increasing the electric performance of the electronic package. According to an electronic package of the present invention, at least two leads of the lead frame have portions joined together to form a first pad and the die pad has a protruding portion to form a second pad thereby allowing the surface-mountable device to be connected across the first pad and the second pad. The present invention further provides another electronic package comprising a tape attached across the leads of the lead frame for supporting the surface-mountable device.

7 Claims, 11 Drawing Sheets

ELECTRONIC PACKAGE WITH SURFACE-MOUNTABLE DEVICE BUILT THEREIN

BACKGROUND OF THE INVENTION

1. Field of the Invention

The present invention generally relates to electronic packages, and more particularly to lead frame packages characterized by directly mounting surface-mountable devices on lead frame.

2. Description of the Related Art

An electronic package typically includes a lead frame with one or more active devices attached thereon; packages including only one device are known as Single Chip Modules (SCM), while packages including a plurality of devices are called Multi Chip Modules (MCM). The active device is typically a chip commonly made of Silicon, Germanium or Gallium Arsenide.

FIG. 1 depicts a conventional electronic package comprising a lead frame for supporting a semiconductor chip 100. The lead frame includes a plurality of leads having outer lead portions 106 and inner lead portions 107. The chip 100 is attached onto a die pad 111 using a die attach adhesive such as silver paste 114. The die pad 111 is connected to the lead frame by supporting bars (not shown in FIG. 1). The outer lead portions 106 are used for electrical coupling to an outside circuit. The chip 100 has bond pads electrically interconnected to the inner lead portions 107 of the lead frame through bonding wires 115. The chip 100, the die pad 111, the inner lead portions 107 of the lead frame and bonding wires 115 are encapsulated in a package body 117 made of insulating material such as epoxy.

As the speed of semiconductor devices increase, noise in the DC power and ground lines increasingly becomes a problem. To reduce this noise, passive components such as decoupling capacitors are often used to reduce power supply noise which occurs due to change in potential difference between the ground voltage and the power-supply voltage supplied to the active device. The decoupling capacitors are typically surface-mountable devices (SMD's) used in the so-called surface-mounting technique. The decoupling capacitors are placed as close to the active device as practical to increase their effectiveness. For high pin count packages commonly encountered in the electronics manufacturing industry, as the number of I/O connections increases, finer pitches of the outer leads are required (i.e., below 0.5 mm) for the lead frame used therein. Therefore, lead frames for high pin count packages usually have a fine structure such that the decoupling capacitors cannot be directly mounted on the leads of the lead frames. Some wafers have capacitors built into the architecture of each chip, thereby significantly enhancing the electrical performance thereof. However, that will complicate the manufacturing process of wafer thereby increasing the production cost.

Accordingly, the present invention seeks to provide a method for directly mounting surface-mountable devices on a lead frame, which overcomes, or at least reduces the above-mentioned problems of the prior art.

SUMMARY OF THE INVENTION

It is a primary object of the present invention to provide an electronic package with surface-mountable devices built therein. The electronic package comprises a lead frame for supporting a semiconductor chip and is characterized in that the surface-mountable devices are directly mounted on the lead frame thereby increasing the electric performance of the electronic package.

The electronic package in accordance with the present invention mainly comprises a lead frame including a die pad and a plurality of conductive leads; a semiconductor chip disposed on the die pad and electrically connected to the leads; a surface-mountable device disposed on the lead frame; and a package body encapsulating a portion of the lead frame, the semiconductor chip and the surface-mountable device. Preferably, the surface-mountable device is a passive component such as a resistor, a capacitor or an inductor.

In a preferred embodiment of the present invention, at least two leads of the lead frame have portions joined together to form a first pad and the die pad has a protruding portion to form a second pad such that the surface-mountable device is connected across the first pad and the second pad.

In another preferred embodiment of the present invention, at least two adjacent leads of the lead frame have portions joined together to form a first pad and at least another two adjacent leads of the lead frame have portions joined together to form a second pad. In addition, the electronic package further comprises a tape that is attached across the leads of the lead frame and has two openings formed corresponding to the first pad and the second pad. In this embodiment, the surface-mountable device is supported by the tape and connected across the first pad and the second pad through the openings of the tape.

In a further preferred embodiment of the present invention, the electronic package further comprises a tape attached across the leads of the lead frame and at least one layer of electrical circuitry formed on the tape. The electrical circuitry comprises two first pads and two second pads respectively coupled to the first pads. Each of the first pads has an aperture formed corresponding to one predetermined lead. The tape has openings formed corresponding to the apertures of the first pads. In this embodiment, the surface-mountable device is supported by the tape and connected across the two second pads. The apertures and corresponding openings are filled with a conductive paste so as to electrically connect the surface-mountable device to the predetermined leads.

According to a still further preferred embodiment of the present invention, the electronic package further comprises a tape attached across the leads of the lead frame and at least one layer of electrical circuitry formed on the tape. The electrical circuitry comprises two first pads and two second pads respectively coupled to the first pads. In this embodiment, the two first pads are adapted to support the surface-mountable device and the two second pads are adapted for wire bonding to the semiconductor chip.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
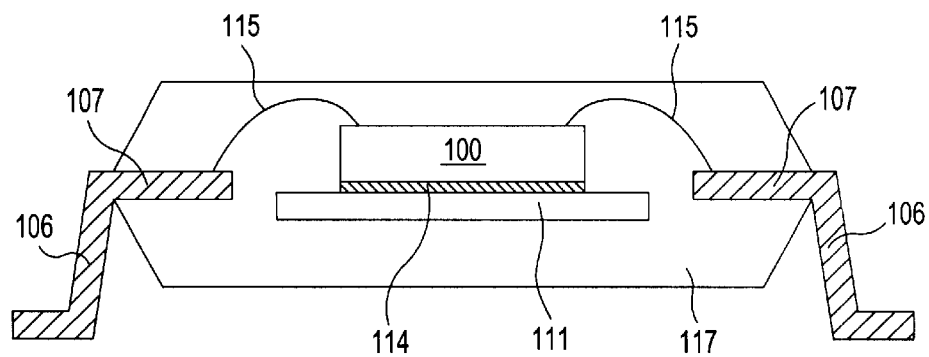
FIG. 1 is a cross sectional view of a conventional electronic package.
Figure 2:
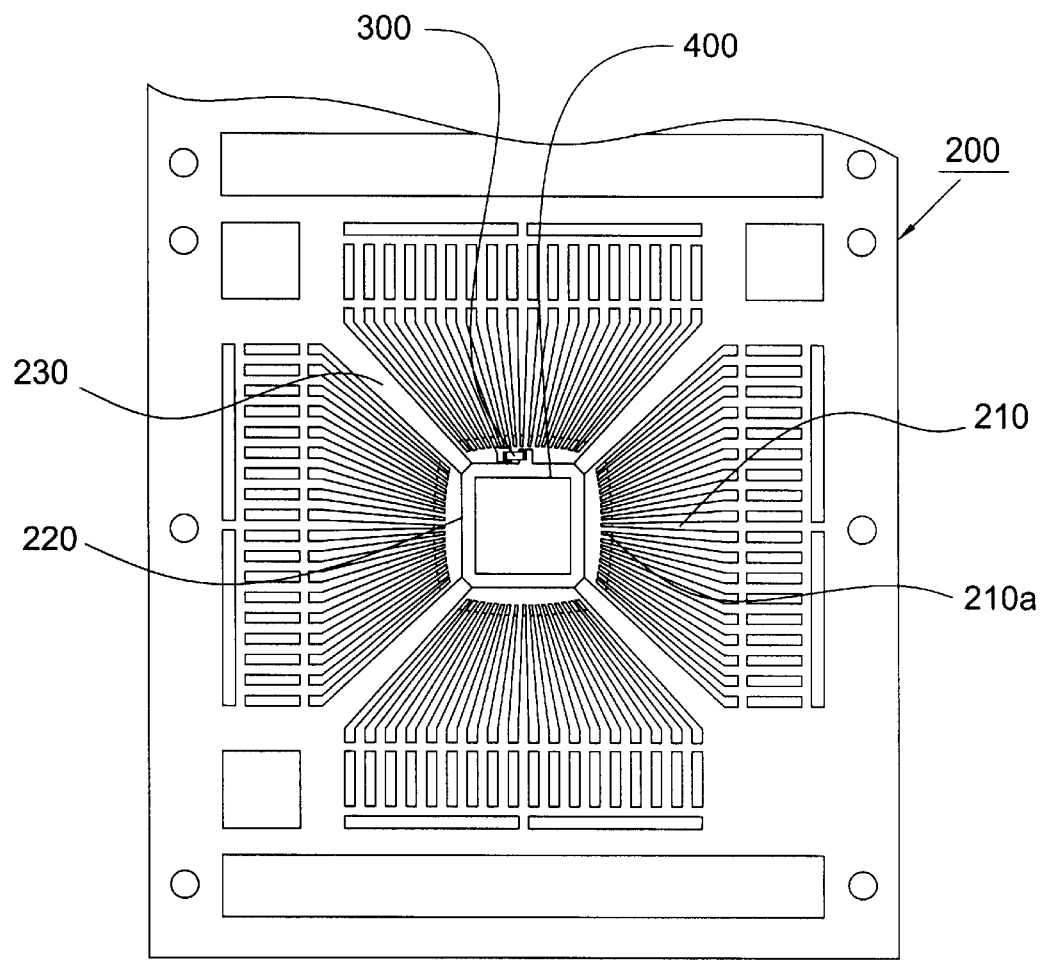
FIG. 2 is a top plan view of a lead frame according to a first preferred embodiment of the present invention illustrating a surface-mountable device and a chip mounted on the upper surface of the lead frame.

FIG. 2 shows a lead frame 200 according to a first preferred embodiment of the present invention. As shown, a surface-mountable device 300 and a chip 400 are mounted on the upper surface of the lead frame. Lead frames may be manufactured in long strips of many individual units (only one shown in FIG. 2). The lead frame 200 includes a plurality of conductive leads 210 arranged around a die pad 220. The die pad 220 is connected to the lead frame 200 by four tie bars 230. Usually, inner ends 210a of the leads 210 are plated with a layer of metal, such as silver, gold, or palladium, which bonds well with conventional bonding wire material.

Figure 3:
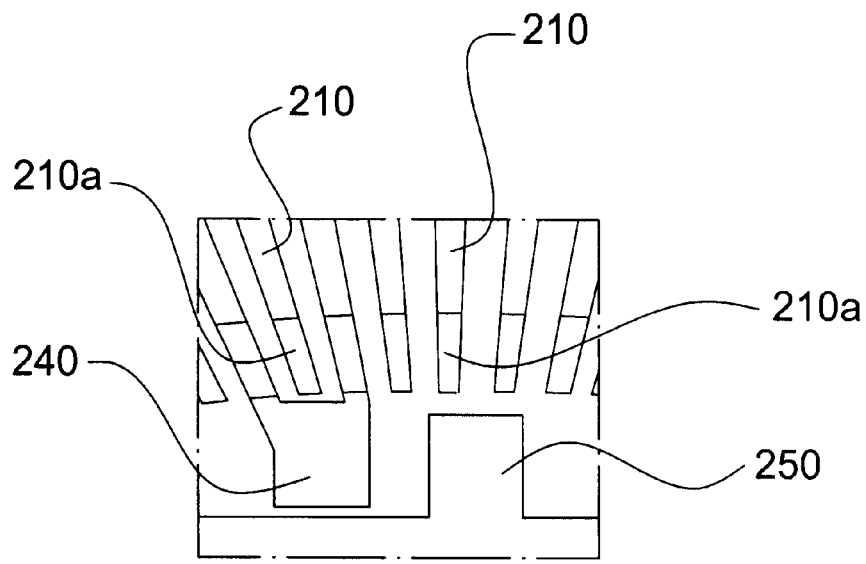
FIG. 3 is a top plan view showing a portion of the lead frame in FIG. 2 on an enlarged scale.
Figure 4:
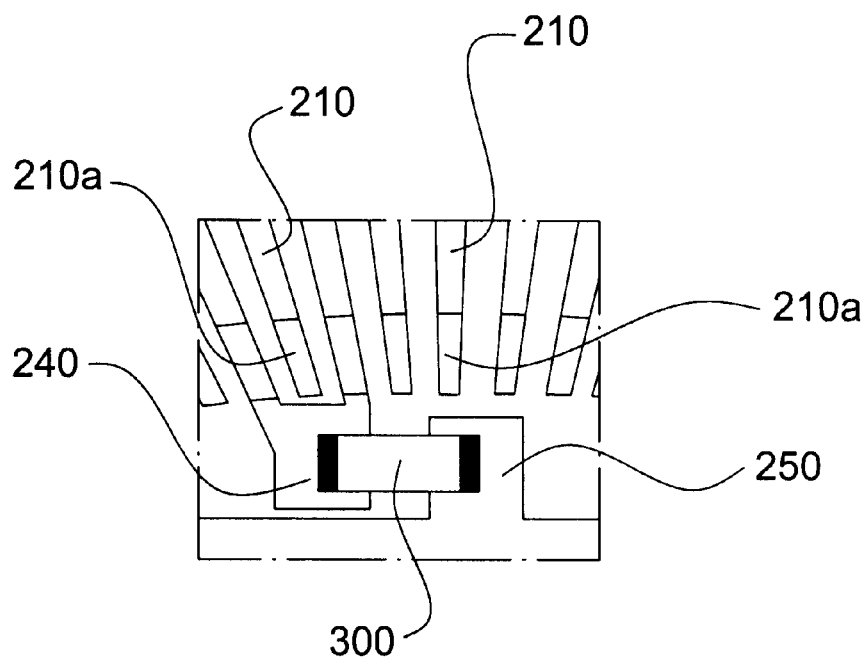
FIG. 4 illustrates, in an enlarged top plan view, a portion of the lead frame in FIG. 2 with the surface-mountable device mounted thereon.

Referring to FIG. 2 and FIG. 3, the lead frame 200 is characterized in that at least two leads have portions joined together to form a pad 240 and the die pad 220 has a protruding portion to form a pad 250. It should be understood that the pads 240, 250 are formed between the inner ends 210a of the leads 210 and the die pad 220. It is noted that the inner ends of the leads connected to the pad 240 are still ready for wire bonding. Usually, the surface-mountable device 300 (see FIG. 4) is secured to the pads 240, 250 through two end contacts of the device 300 by bonding materials such as solder paste.

Figure 5:
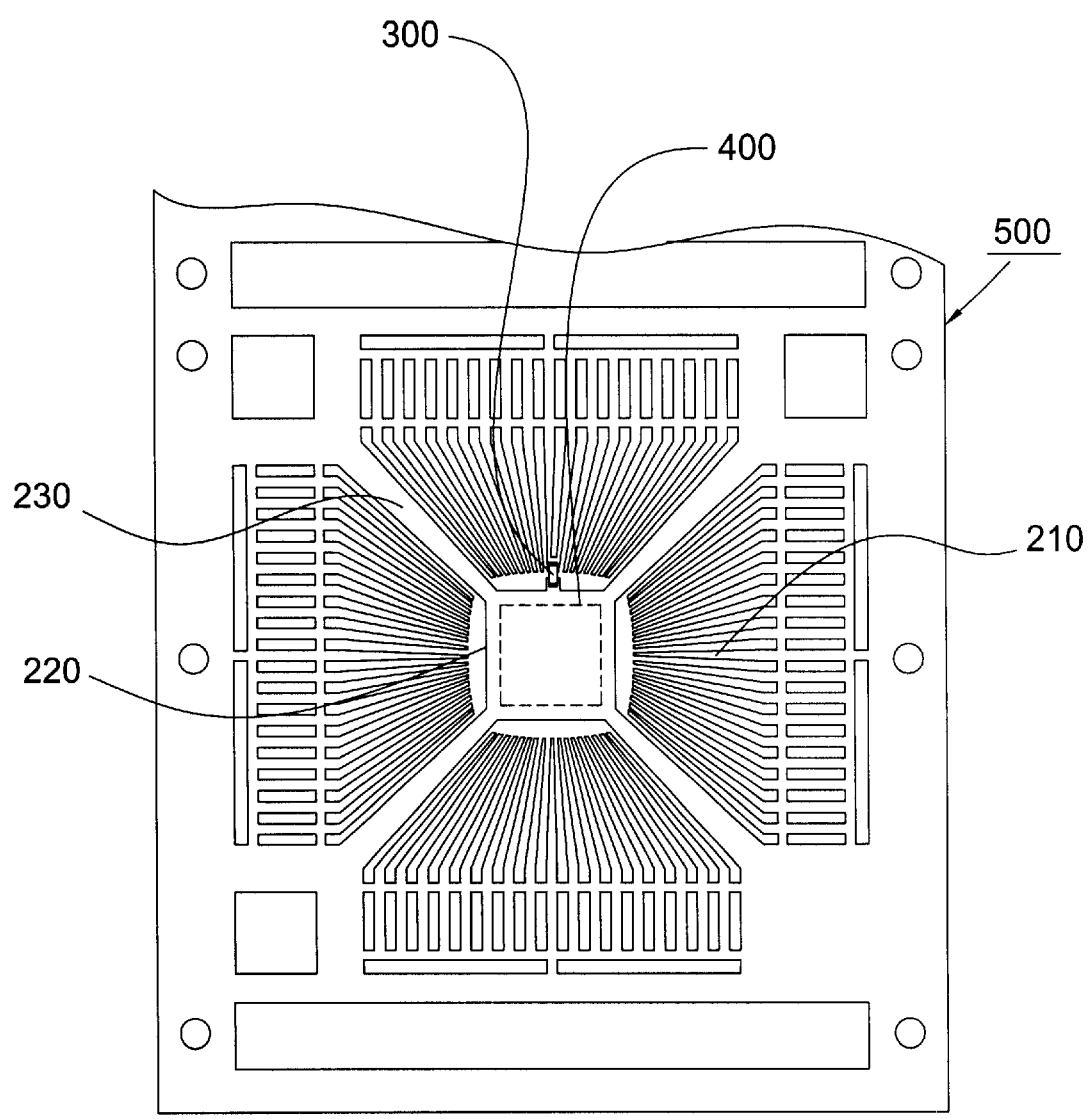
FIG. 5 is a bottom plan view of a lead frame according to a second preferred embodiment of the present invention illustrating a surface-mountable device mounted on the lower surface of the lead frame and a chip mounted on the upper surface of the lead frame.

FIG. 5 shows, in a bottom plan view, a lead frame 500 according to a second preferred embodiment of the present invention. As shown, a surface-mountable device 300 is mounted on the lower surface of the lead frame 500 and a chip 400 (indicated by dotted line shown in FIG. 5) is mounted on the upper surface of the lead frame 500.

Figure 6:
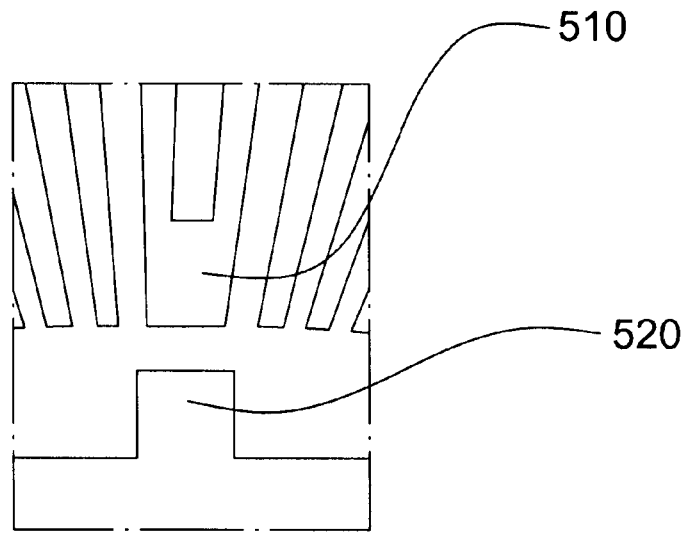
FIG. 6 is a top plan view showing a portion of the lead frame in FIG. 5 on an enlarged scale.
Figure 7:
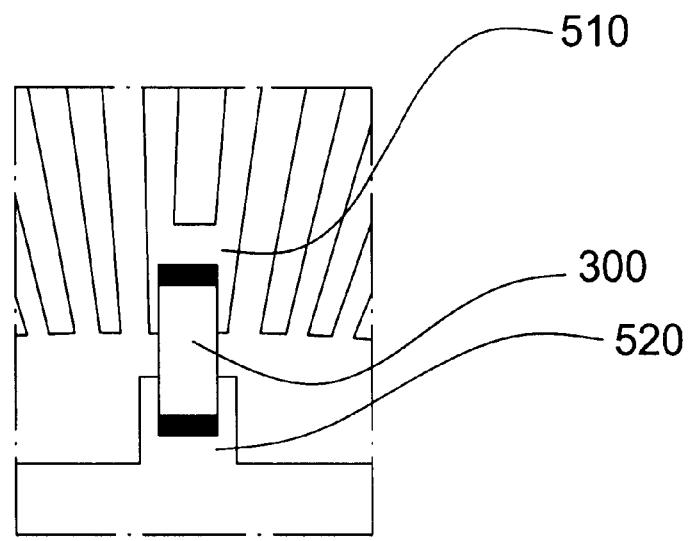
FIG. 7 illustrates, in an enlarged top plan view, a portion of the lead frame in FIG. 5 with the surface-mountable device mounted thereon.

Referring to FIG. 6, the lead frame 500 is characterized in that at least two leads have portions joined together to form a pad 510 and the die pad 220 has a protruding portion to form a pad 520. It is noted that only the pad 520 extends between the inner ends 210a of the leads 210 and the die pad 220. As shown in FIG. 7, the surface-mountable device 300 is secured to the pads 510, 520 through two end contacts of the device 300 by bonding materials such as solder paste. It should be understood that since the pad 510 is formed on the lower surface of the lead frame 500, the bonding material for SMT device will not contaminate the predetermined areas of leads (i.e., the upper surface of the inner ends) adapted for wire bonding. Therefore, before wire bonding, it is not necessary to treat the upper surface of the inner ends with a time-consuming plasma clean process.

It should be understood that, in the first and the second embodiments, the surface-mountable device may be a passive component such as a capacitor or a resistor, excluding resistor. Furthermore, the lead frame in accordance with the present invention is formed from a thin metal strip, which has been etched or stamped to form a pattern similar to that shown in FIG. 2 or FIG. 5. Preferably, the lead frame is made of copper or alloys containing copper. Alternatively, the lead frame may be made of iron, nickel or alloys thereof, and then plated with copper.

Figure 8:
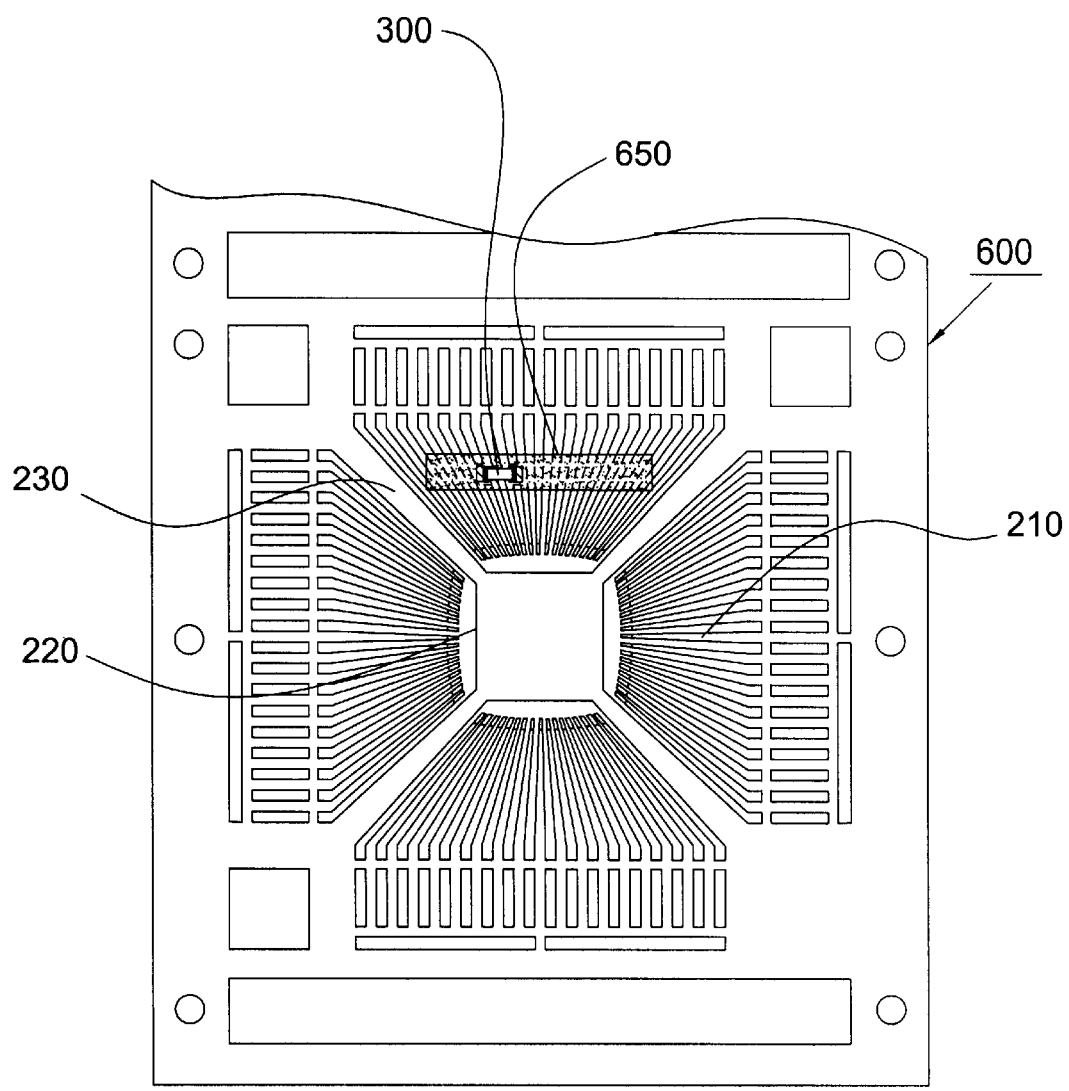
FIG. 8 is a top plan view of a lead frame with a tape attached thereon according to a third preferred embodiment of the present invention illustrating a surface-mountable device mounted thereon.
Figure 9:
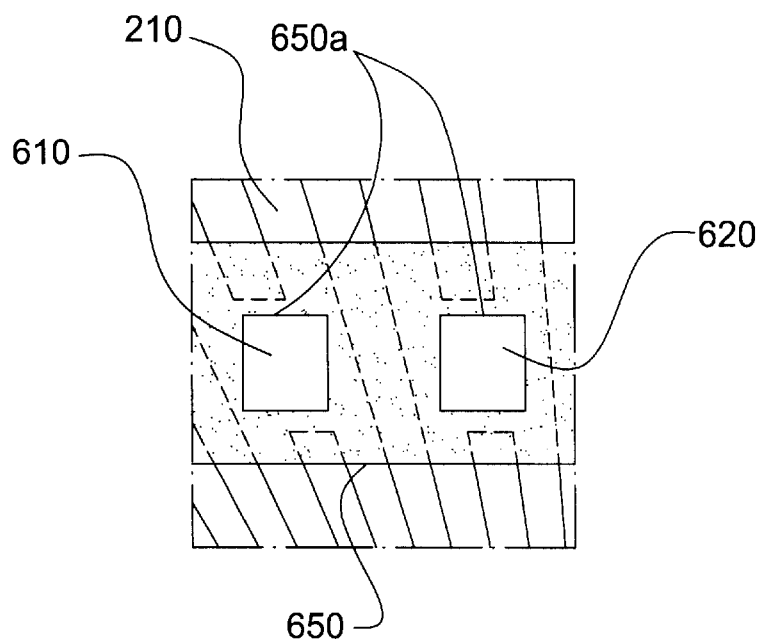
FIG. 9 is a top plan view showing a portion of the lead frame and the tape attached thereon in FIG. 8 on an enlarged scale.
Figure 10:
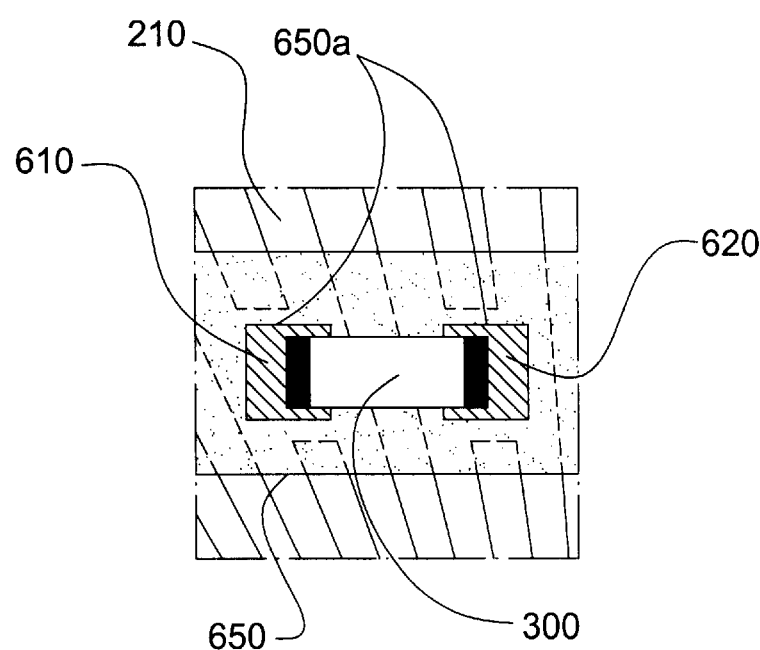
FIG. 10 illustrates, in an enlarged top plan view, a portion of the lead frame and the tape in FIG. 8 with the surface-mountable device mounted thereon.

FIG. 8 shows a lead frame 600 with a tape 650 attached thereon according to a third preferred embodiment of the present invention. As shown, a surface-mountable device 300 is mounted on the tape. Referring to FIG. 9, the lead frame 600 is characterized in that at least two adjacent leads have portions joined together to form a pad 610 and at least another two adjacent leads have portions joined together to form a pad 620. The tape 650 is attached across the leads of the lead frame and has two openings 650a formed corresponding to the pads 610, 620. In this embodiment, the surface-mountable device 300 (see FIG. 10) is supported by the tape 650 and connected across the pads 610, 620. The tape 650 may be a lead-fixing tape composed of a polyimide resin or the like, which is punched and bonded to the leads of the lead frame with an adhesive layer.

Figure 11:
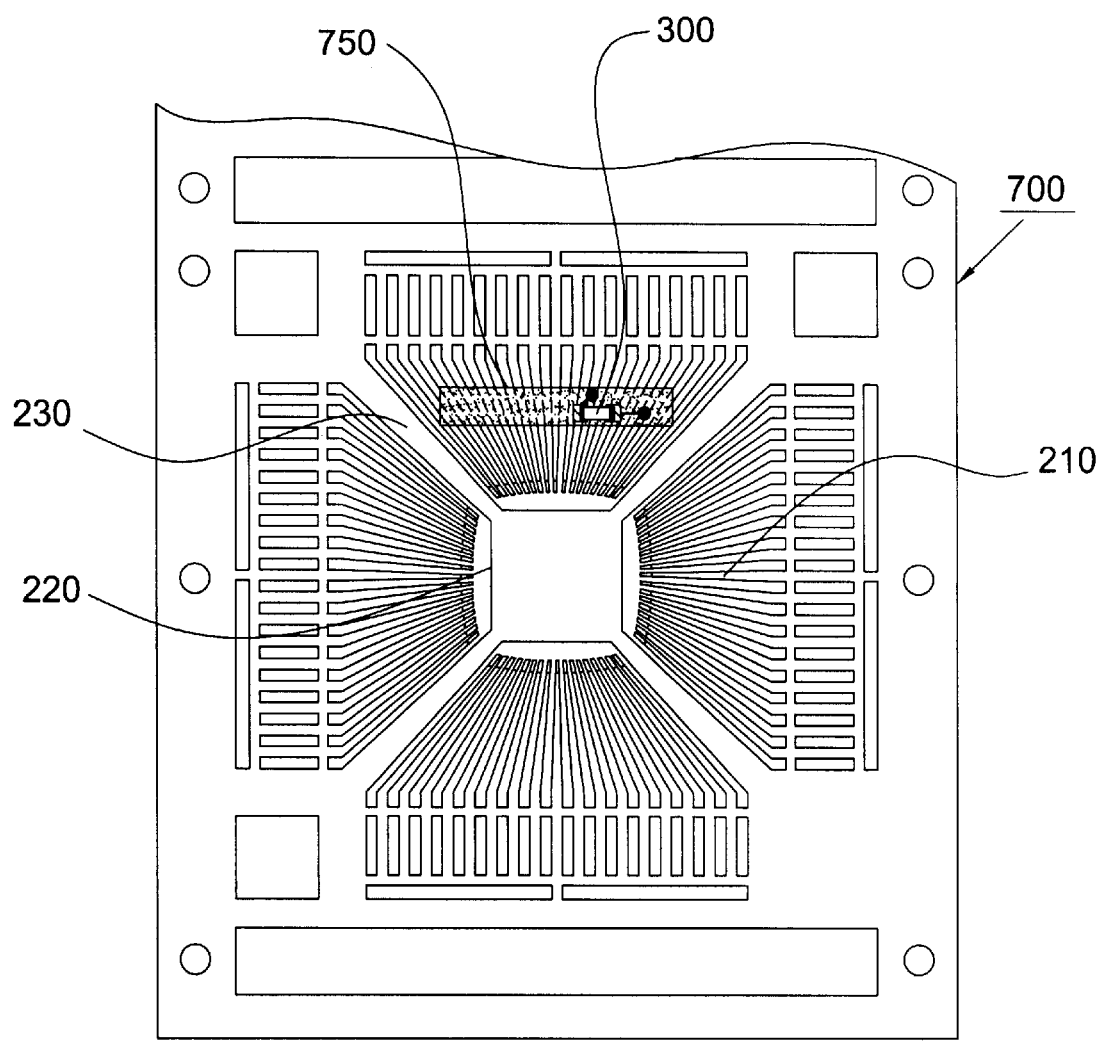
FIG. 11 illustrates, in a top plan view, a tape having a layer of electrical circuitry according to a fourth preferred embodiment of the present invention attached on a lead frame and a surface-mountable device mounted on the tape.
Figure 12:
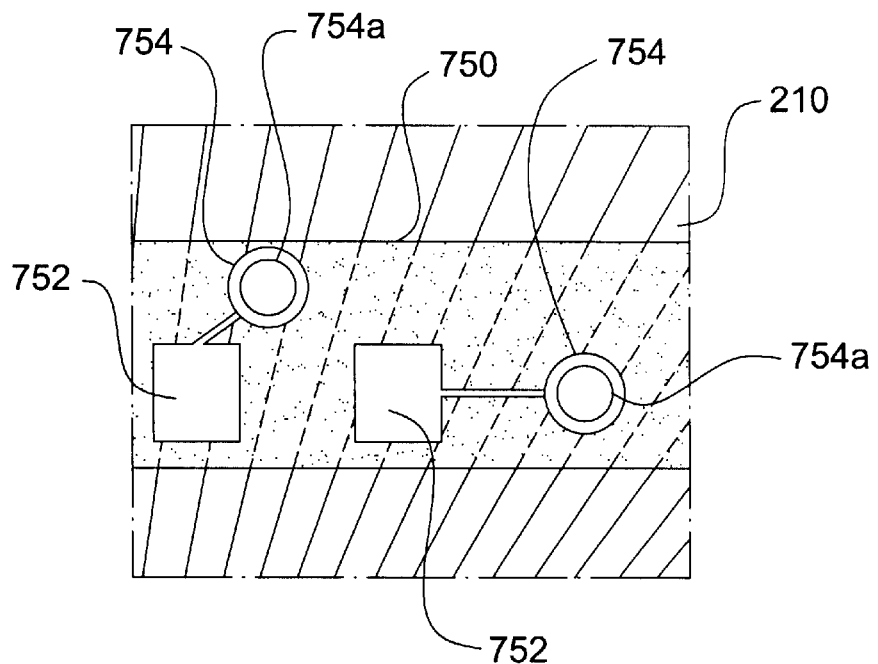
FIG. 12 is a top plan view showing a portion of the lead frame and the tape attached thereon in FIG. 11 on an enlarged scale.
Figure 13:
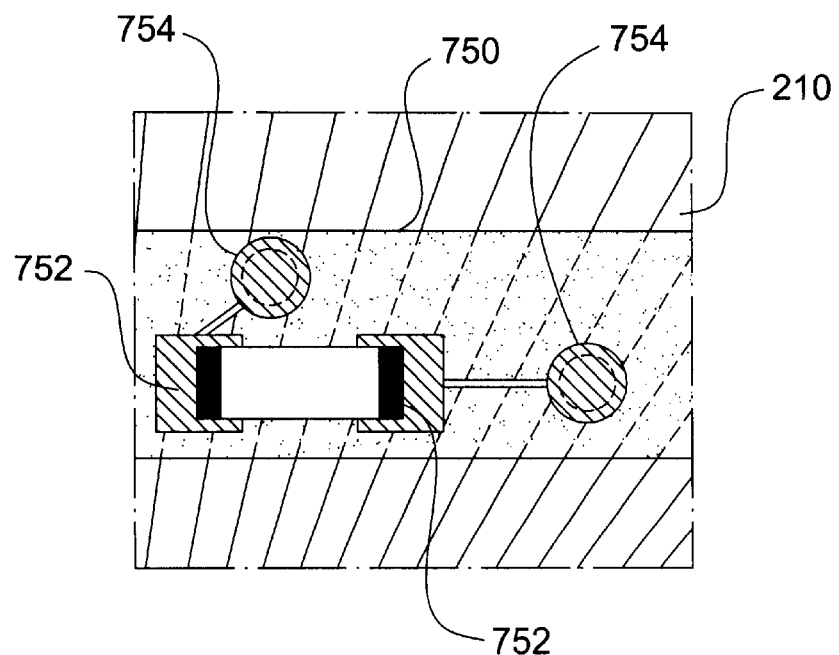
FIG. 13 illustrates, in an enlarged top plan view, a portion of the lead frame and the tape in FIG. 11 with the surface-mountable device mounted thereon.

FIG. 11 shows a tape 750 having a layer of electrical circuitry according to a fourth preferred embodiment of the present invention attached on a lead frame 700. As shown in FIG. 12, the electrical circuitry comprises two pads 752 and another two pads 754 respectively coupled to the pads 752. Each pad 754 has an aperture 754a formed corresponding to one predetermined lead 210. The tape 750 has openings formed corresponding to the apertures 754a of each pad 754. In this embodiment, a surface-mountable device 300 (see FIG. 13) is supported by the tape 750 and connected across the two pads 752. The apertures 754a of the pads 754 and corresponding openings of the tape are filled with a conductive paste so as to electrically connect the surface-mountable device 300 to the predetermined leads. The conductive paste may be conductive epoxy (such as silver paste) or solder paste. The tape 750 may be formed from a dielectric film (suitable dielectric material such as polyimide). The film is punched and laminated with a conductive metal layer (such as a copper foil). Then the desired electric circuit is formed from the conductive metal layer on the dielectric film through photolithography and etching.

Figure 14:
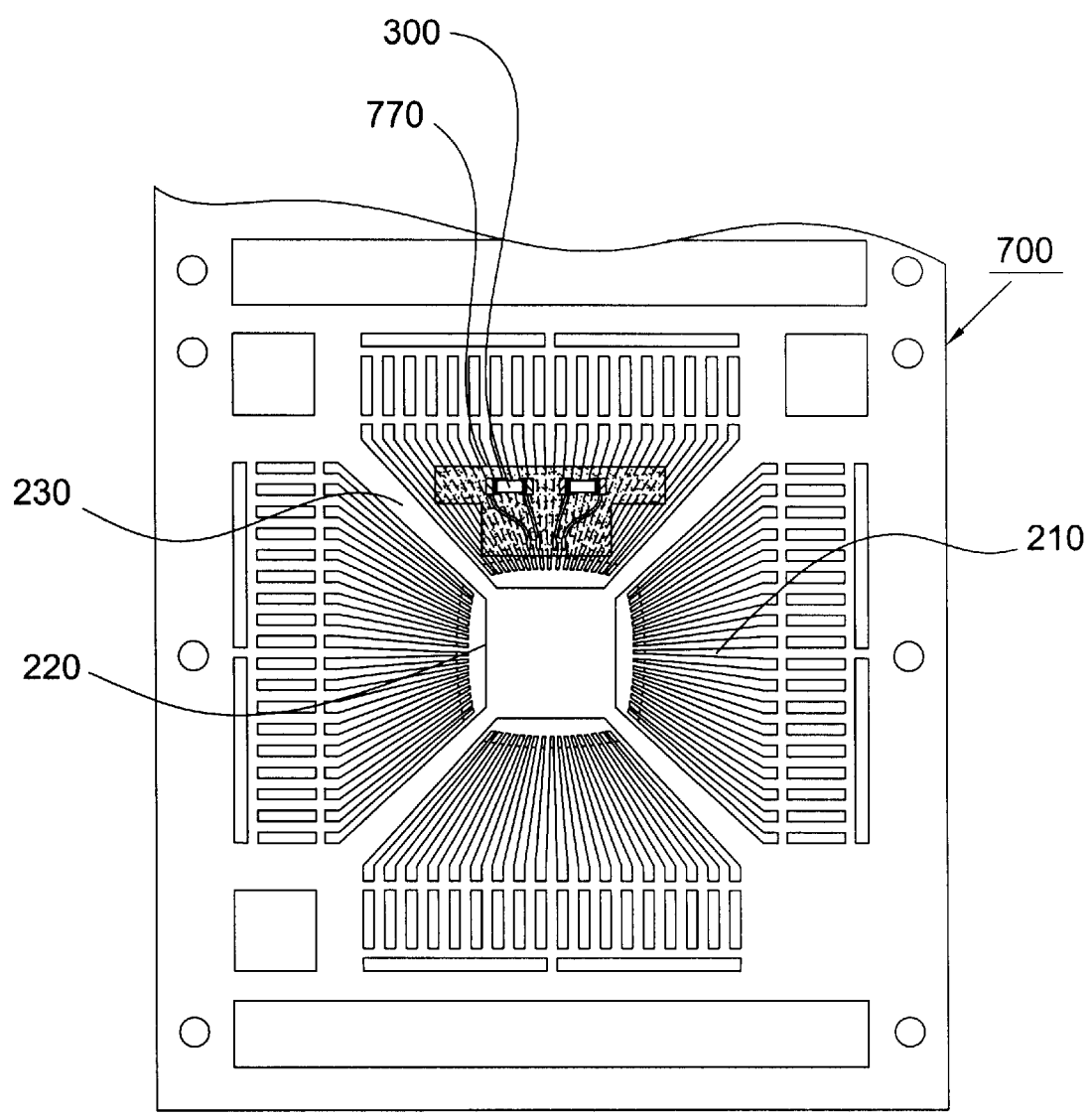
FIG. 14 illustrates, in a top plan view, a tape having a layer of electrical circuitry according to a fifth preferred embodiment of the present invention attached on a lead frame and a surface-mountable device mounted on the tape.
Figure 15:
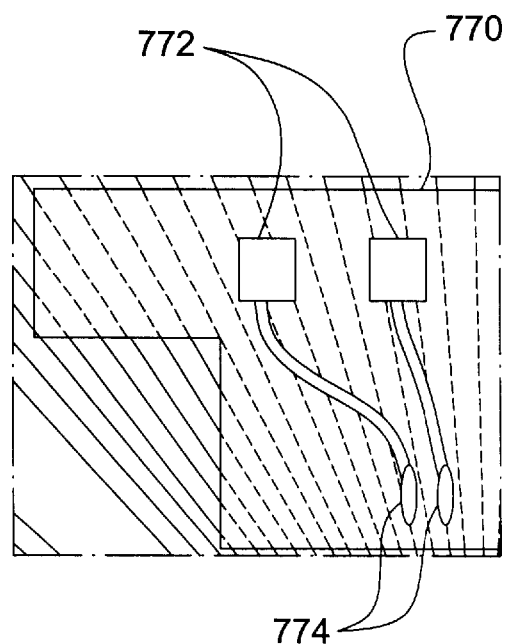
FIG. 15 is a top plan view showing a portion of the lead frame and the tape attached thereon in FIG. 14 on an enlarged scale.
Figure 16:
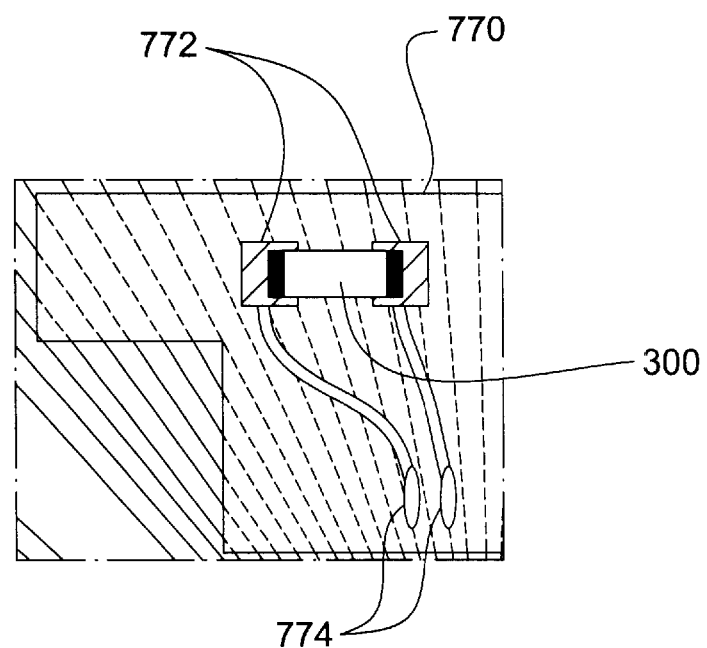
FIG. 16 illustrates, in an enlarged top plan view, a portion of the lead frame and the tape in FIG. 14 with the surface-mountable device mounted thereon.

FIG. 14 shows a tape 770 having a layer of electrical circuitry according to a fifth preferred embodiment of the present invention attached on a lead frame 700. As shown in FIG. 15, the electrical circuitry comprises two pads 772 and another two pads 774 respectively coupled to the pads 772 with a conductive trace. The pads 774 are formed at locations proximal to the inner ends 210a of the leads 210 for wire bonding to predetermined chip bonding pads. Preferably, the pads 774 are plated with a layer of metal, such as silver, gold, or palladium, which bonds well with conventional bonding wire material. In this embodiment, the surface-mountable device 300 (see FIG. 16) is supported by the tape 770 and connected across the two pads 772.

Referring to FIG. 8, FIG. 11 and FIG. 14, even though the lead frame has a very fine lead structure, the surface-mountable device still can be mounted on the tape attached across the leads with good support. In the third, fourth, and fifth embodiments of the present invention, the surface-mountable device is preferably a passive component. It could be understood that the passive components may include capacitors, resistors and inductors arranged as filters to suppress power source noises and attain speed-up of the operation of the chip.

It should be understood that, in the electronic package of the present invention, the semiconductor chip is securely attached onto the die pad of the lead frame using a die attach adhesive such as silver paste. Usually, the semiconductor chip has a plurality of bond pads electrically interconnected to the lead frame through bonding wires such as gold wires (not shown). The gold wires are connected to the inner ends of the leads and the corresponding bond pads using known wire bonding techniques. The lead frame, the semiconductor chip, the bonding wires and the surface-mountable device are encapsulated in a package body (not shown) such that each lead of the lead frame has at least a portion left exposed for electrical connection to outside. Typically, the package body is formed by known plastic molding methods such as transfer molding.

Although the invention has been explained in relation to its preferred embodiment, it is to be understood that many other possible modifications and variations can be made without departing from the spirit and scope of the invention as hereinafter claimed.

What is claimed is:

1. An electronic package, comprising:
   a lead frame having opposing upper and lower surfaces, the lead frame including a die pad and a plurality of conductive leads, at least two of the conductive leads having portions joined together to form a first pad, the die pad having a protruding portion to form a second pad;
   a semiconductor chip disposed on the die pad and electrically connected to the leads;
   a surface-mountable device connected across the first pad and the second pad; and
   a package body encapsulating the lead frame, the semiconductor chip and the surface-mountable device so that each lead of the lead frame has at least a portion left exposed for electrical connection to outside circuitry;
   wherein the semiconductor chip is mounted on the upper surface of the lead frame and the surface-mountable device is mounted on the lower surface of the lead frame.

2. An electronic package, comprising:
   a lead frame including a die pad and a plurality of conductive leads;
   a tape attached across a number of the leads;
   at least one layer of electrical circuitry formed on the tape, the electrical circuitry comprising two first pads and two second pads respectively coupled to the first pads, each of the first pads having an aperture formed corresponding to one predetermined lead among said conductive leads and the tape has openings formed corresponding to the apertures of the first pads;
   a surface-mountable device supported by the tape and connected across the second pads;
   a conductive paste filled in the apertures and corresponding openings wherein each of the first pads is electrically connected to the corresponding predetermined lead exclusively by the conductive paste;
   a semiconductor chip disposed on the die pad and electrically connected to the leads; and
   a package body encapsulating the lead frame, the semiconductor chip and the surface-mountable device so that each lead of the lead frame has at least a portion left exposed for electrical connection to outside circuitry.

3. The electronic package as claimed in claim 2, wherein the conductive paste is formed from a solder paste.

4. The electronic package as claimed in claim 2, wherein the conductive paste is a conductive epoxy.

5. The electronic package as claimed in claim 2, wherein the surface-mountable device is a passive component.

6. The electronic package as claimed in claim 5, wherein the passive component is one of a capacitor, a resistor, and an inductor.

7. An electronic package, comprising:
   a lead frame having opposing upper and lower surfaces, the lead frame including a die pad and a plurality of conductive leads, at least two of the conductive leads having portions joined together to form a first pad, the die pad having a protruding portion to form a second pad;
   a semiconductor chip disposed on the die pad and electrically connected to the leads;
   a surface-mountable device connected across the first pad and the second pad; and
   a package body encapsulating the lead frame, the semiconductor chip and the surface-mountable device so that each lead of the lead frame has at least a portion left exposed for electrical connection to outside circuitry;
   wherein each of said at least two leads has a discrete inner end portion adapted for wire bonding to the chip; and
   the semiconductor chip is mounted on the upper surface of the led frame and the surface-mountable device is mounted on the lower surface of the lead frame.

* * * * *